US005685949A

United States Patent [19]

Yashima

[11] Patent Number: 5,685,949
[45] Date of Patent: Nov. 11, 1997

[54] PLASMA TREATMENT APPARATUS AND METHOD

[75] Inventor: Koji Yashima, Suwa, Japan

[73] Assignee: Seiko Epson Corporation, Tokyo, Japan

[21] Appl. No.: 590,057

[22] Filed: Jan. 16, 1996

[30] Foreign Application Priority Data

Jan. 13, 1995 [JP] Japan ............................ 7-004484
Nov. 22, 1995 [JP] Japan ............................ 7-328147

[51] Int. Cl.$^6$ ............................................... H01L 21/00
[52] U.S. Cl. ................... 156/643.1; 156/345; 118/723; 437/247
[58] Field of Search ................... 156/643.1, 657.1, 156/662.1, 345 LT, 345 MW, 345 PH; 118/723 R, 723 MW, 723 E, 724; 437/247, 248

[56] References Cited

U.S. PATENT DOCUMENTS 4,857,382 8/1989 Liu et al. ........................ 156/345
5,178,682 1/1993 Tsukamoto et al. .............. 156/345

FOREIGN PATENT DOCUMENTS

60-001862 1/1985 Japan.
2-281734 11/1990 Japan.

Primary Examiner—William Powell
Attorney, Agent, or Firm—Stroock & Stroock & Lavan LLP

[57] ABSTRACT

A plasma treatment apparatus for plasma treating an object to be treated or workpiece by exposure to ions, free radicals and activated gas species generated by a plasma discharge includes a suscepter electrode supposing the workpiece and another electrode facing the suscepter electrode, together constituting a pair of plasma generating electrodes across which an AC voltage is applied. The apparatus also includes halogen lamps which are disposed outside of the respective electrodes for radiating heat rays to the object. The plasma generating electrodes are formed of a material which transmits the heat rays from the halogen lamp and resists a temperature of about 200° C. or higher, such as a doped silicon in which impurities are doped into a silicon substrate. Thus, the object may be treated in a short time and at a low temperature by heating and using a plasma.

25 Claims, 5 Drawing Sheets

PLASMA TREATMENT APPARATUS AND METHOD

BACKGROUND OF THE INVENTION

1. Field of the Invention

The present invention relates generally to a plasma treatment apparatus and method which can treat an object to be treated or workpiece at a low temperature and in a short time, using a plasma and applying heat.

2. Description of the Prior Art

Conventionally, semiconductor wafers are subjected to thermal oxidation by exposure to heat mainly at or about atmospheric pressure. In order to improve the oxidation rate, plasma oxidation may be used. However, plasma oxidation generally requires a vacuum device for generating the plasma in a vacuum.

There is a method for keeping the thermal diffusion of impurities doped through ion-implantation or the like in a semiconductor wafer to a minimum. In such a method, the semiconductor wafer is rapidly heated from about room temperature up to about 1000° C. within several minutes or faster. Then the semiconductor wafer is subjected to a thermal treatment, such as annealing, thermal oxidation and thermal nitrating, for from several seconds up to several minutes. The treated semiconductor wafer is then rapidly brought back to about room temperature within several minutes or faster. This method is generally called the Rapid Thermal (RT) treatment and is disclosed in, for example, Japanese Patent Application Laid-Open No. 60-1862. A heat source used in the RT treatment may take the form of a halogen lamp which has a small thermal capacity, and can change its temperature almost instantaneously. The conventional Rapid Thermal Oxidation, which incorporates the RT treatment, heats semiconductor wafer sheets up to about 1000° C. or higher within an oxygen atmosphere but without use of a plasma.

On the other hand, the RT treatment of nitrating, for example, silicon oxide films, is called Rapid Thermal Nitrogenation (RTN). The conventional RTN involves rapidly heating semiconductor wafer sheets up to about 1000° C. or higher and using an atmosphere of reactive gases such as ammonia and $N_2O$. Conventional RTN is also performed without use of a plasma.

Generation of a plasma discharge generally requires a pair of plasma generating electrodes, one of which carries the object to be treated or workpiece and an opposite electrode. The electrode carrying the workpiece is called a susceper electrode. In this case, however, the object to be treated or workpiece may not be heated efficiently because the generally metallic electrodes reflect radiant heat from the RT heat source. This is a fatal disadvantage, particularly for RT treatments.

It may be effective to provide a heater in a susceper electrode on which an object to be treated or workpiece is to be placed. However, the heater heats to a high temperature where the heater wires are mounted. This provides a temperature distribution along the plane parallel to the object to be treated or workpiece, and prevents the uniform heating of the object to be treated or workpiece.

Prior art vacuum plasma devices have various disadvantages, such as increases in manufacturing costs and the large size of the vacuum plasma devices as well as the time required to bring an object to be treated or workpiece to a vacuum pressure and back to ambient atmospheric pressure. The plasma treatment at atmospheric pressure raises a problem in that the rate of treatment slows even when the semiconductor wafer sheets or other workpieces are heated up to about 1000° C. or higher.

SUMMARY OF THE INVENTION

In view of the above problems, of a new apparatus and method for treating an object or workpiece by using an atmospheric plasma and applying heat is disclosed. The apparatus and method allows for a reduction in the treatment time and prevents heating the object to be treated or workpiece to a very high temperature for long periods of time.

To this end, the present invention provides a plasma treatment apparatus for treating an object to be treated or workpiece by exposing it to ions, free radicals and activated gas species which are excited by a plasma discharge, comprising an opposing pair of plasma generating electrodes across which an AC voltage is applied, the plasma generating electrodes including a susceper electrode supporting the object to be treated or workpiece and an electrode opposite to the susceper electrode; and a heat source for radiating heat rays to the object to be treated; and wherein at least one electrode of the pair of plasma generating electrodes faces the heat source and is formed of a material which transmits the heat rays and has a heat resistance to a temperature of about 200° C. or higher.

The present invention also provides a method of plasma treating an object to to be treated or workpiece by exposing it to ions, free radicals and activated gas species excited by a plasma discharge, comprising the steps of: (a) introducing a gas at or about atmospheric pressure to the space between a pair of opposing plasma generating electrodes comprising a susceper electrode supporting the object to be treated or workpiece and an electrode opposite to the susceper electrode; (b) applying an AC voltage across the pair of electrodes; (c) radiating heat rays from a heat source to the object to be treated or workpiece through at least one electrode of the pair of plasma generating electrodes; and (d) treating the object to be treated or workpiece by causing the ions, free radicals and activated gas species excited by the plasma discharge generated between the pair of electrodes to react with the object to be treated or workpiece.

According to the apparatus and method of the present invention, a plasma is generated between the pair of electrodes, and ions, free radicals and activated gas species excited by the plasma react with the object or workpiece which is effectively heated by heat rays passing and radiating through at least one of the pair of plasma generating electrodes, so that a plasma treatment is carried out in a short time.

In addition, unlike the prior art surface treatments, the plasma treatment herein may be carried out at a low temperature due to the combination of a plasma and heat. The apparatus and system herein described, which heats an object to be treated or workpiece effectively by thermal heat rays passing and radiating through at lest one of the pair of plasma generating electrodes is also applicable to a vacuum plasma treatment apparatus as well. A vacuum plasma treatment device with such a system may give some of the same advantages as the atmospheric plasma treatment apparatus herein.

The material forming the one electrode of the pair of plasma generating electrodes which is opposite to the heat source may be doped silicon in which impurities are doped into a silicon substrate. Such doped silicon is a material that fulfills various requirements for the plasma generating electrodes, such as electrical conductivity, heat resistivity and light transmissivity, as is desirable in the electrodes used in the present invention.

The silicon substrate preferably has an impurity concentration of about $10^{15}$ atoms/cm$^3$ or higher. Such an impurity concentration can provide sufficient electrical conductivity for electrodes.

Furthermore, the one electrode of the pair of plasma generating electrodes which is opposite to the heat source may be formed of silicon carbides (SiC) that fulfill the requirements of electrical conductivity, heat resistivity and light transmissivity required for plasma generation.

The one electrode of the pair of plasma generating electrodes which is opposite to the heat source may also be formed of indium-tin-oxide (ITO). ITO may also be used as the transparent electrode of a liquid crystal display and has electrical conductivity and light transmissivity sufficient for use as the plasma generating electrode herein. ITO has relatively low heat resistance, but may be used in a surface treatment at a temperature between about 200° C. and about 300° C., for example.

It is preferable that the one electrode of the pair of plasma generating electrode which is opposite to the heat source has a wall-thickness of about 1 mm or less. Such a wall-thickness can increase the light and heat transmissivity.

If the heat source is opposite to the suscepter electrode, it is preferable that the external diameter of the suscepter electrode be larger than that of the object to be treated or workpiece, and that the object to be treated or workpiece be placed on the uniformly heated central area of the suscepter electrode. The edge portion of the electrode outwardly extending from the object functions as a uniformly heated ring which may typically be formed separately of SiC or the like.

The plasma generating area may be set at or about atmospheric pressure. When the atmospheric plasma itself is heated, the treatment rate may be improved and the treatment system can be reduced in cost and size without any need for a vacuum generating device.

It is further preferable that the plasma treatment apparatus comprises a chamber wall supporting the opposite electrode which forms one electrode of the pair of plasma generating electrodes with the suscepter electrode and that the suscepter electrode is movable relative to the chamber wall and separates the internal space defined by the chamber wall from the outside ambient atmosphere when the chamber wall is engaged with the suscepter electrode. Thus, the object to be treated or workpiece may be moved in or out of the plasma treatment apparatus through the movement of the suscepter electrode. The suscepter electrode can also function as a shutter for separating the internal plasma treatment space defined by the chamber from the outside atmosphere.

It is further preferable that the chamber wall is formed of, for example, quartz, and the wall-thickness of the suscepter electrode is smaller than that of the chamber wall. As discussed above, the thinner the suscepter electrode is, the higher light and heat transmissivity becomes. It is thus preferred that the wall-thickness of the suscepter electrode be less than that of the chamber wall since the chamber wall need to be thicker as it is a support structure for the device and thus requires strength.

It is further preferable that the plasma treatment apparatus comprises a gas reservoir which is formed between the chamber wall and the one electrode of the pair of plasma generating electrodes opposite the suscepter electrode and is connected to a gas inlet pipe. Preferably, this opposite electrode also includes a number of gas passing apertures formed therethrough for permitting a gas to pass through the opposite electrode. The concentration of the introduced gas can be equalized and uniformly diffused through the apertures of the opposite electrode, resulting in improvement of the treatment rate over the object to be treated or workpiece. In addition, the gas introduced into the gas reservoir can be pre-heated by the heat source which faces the opposite electrode, resulting in improvement of the treatment efficiency.

Another aspect of the present invention provides a plasma treatment apparatus for treating an object to be treated or workpiece through ions, free radicals and activated gas species which are excited at or about atmospheric pressure, comprising: a first chamber including a pair of plasma generating electrodes each of which generates a plasma discharge for exciting an introduced gas to form ions, free radicals and activated gas species; a second chamber in which the object be treated or workpiece is disposed and treated by the ions, free radicals and activated gas species from the first chamber; and a heat source for heating and radiating the object to be treated or workpiece in the second chamber.

Yet another aspect of the present invention provides a method of using such a plasma treatment apparatus to plasma treat an object to be treated or workpiece by ions, free radicals and activated gas species which are generated by a plasma discharge comprising the steps of: (a) introducing a gas at or about atmospheric pressure between a pair of plasma generating electrodes disposed in a first chamber; (b) applying an AC voltage across the pair of plasma generating electrodes to generate a plasma discharge for exciting the gas to generate ions, free radicals and activated gas species; (c) radiating heat rays from a heat source to the object to be treated or workpiece disposed in a second chamber; and (d) treating the object to be treated or workpiece by introducing the ions, free radicals and activated gas species generated in the first chamber into the second chamber in which the ions, free radicals and activated gas species are reacted with the object to be treated or workpiece.

According to the method disclosed, a plasma is generated in the first chamber between the pair of plasma generating electrodes. The plasma then excites ions, free radicals and activated gas species that in turn react on the object or workpiece which is effectively heated by heat rays radiated from the heat source. Thus, the plasma treatment time is reduced. In addition, the heat can be applied simultaneously with the plasma to perform the plasma treatment for a reduced time. The incidence of the heat rays will not be obstructed by the electrode since the second chamber does not include any plasma generating electrode.

Yet another aspect of the present invention provides a plasma treatment apparatus for treating an object to be treated or workpiece through ions, free radicals and activated gas species generated at or about atmospheric pressure by plasma discharge, comprising: a first chamber for exciting an introduced gas through microwaves to generate a plasma discharge and form the ions, free radicals and activated gas species; a second chamber in which the object to be treated or workpiece is disposed and treated by the ions, free radicals and activated gas species generated by plasma discharge in the first chamber; and a heat source for heating and radiating the object to be treated or workpiece in the second chamber.

Still another aspect of the present invention provides a method of using such a plasma treatment apparatus to plasma treat an object to be treated or workpiece by ions, free radicals and activated gas species excited by a plasma discharge comprising the steps of: (a) introducing a gas at or about atmospheric pressure into a first chamber; (b) radiating microwaves into the first chamber to generate a plasma discharge, for exciting the gas to generate ions, free radicals and activated gas species; (c) radiating heat rays to the object to be treated or workpiece disposed in a second chamber; and (d) treating the object to be treated or workpiece by conducting the ions, free radicals and activated gas species generated by plasma discharge in the first chamber into the second chamber in which the ions, free radicals and activated gas species are reacted with the object to be treated or workpiece.

The above apparatus and method are different from the apparatus and method in which a plasma is generated by the electrodes in the first chamber, because a non-polar plasma discharge is generated by the microwave excitation. Just like the aforementioned apparatus and method in each aspect of the invention, it is possible to treat an object in a short time and at a relatively low temperature using a plasma non-polar and applying heat.

The heat source may be disposed within the second chamber. Thus, the heating rate can be further improved since the heat rays do not pass through any electrode or chamber wall.

In the above plasma treatment systems, the heat source may take the form of rapid thermal heating means for heating an object to be treated at about 90° C./min or higher. Thus, these systems can easily accomplish the conventional RT treatment as well.

The aforementioned methods may also be modified in the following manner:

If a plasma discharge gas is introduced with an oxidation gas in step (a), the surface of the object to be treated or workpiece may be oxidated in step (d).

If a plasma discharge gas is introduced with a nitriding gas in step (a), the surface of the object to be treated may be subjected to nitriding in step (d).

If a plasma discharge gas is introduced between the pair of plasma generating electrodes together with an ashing gas in step (a), the surface of the object to be treated may be ashed in step (d).

If a plasma discharge gas is introduced with an etching gas in step (a), the surface of the object to be treated may be etched in step (d). The plasma discharge and etching gases for an etching treatment may each be helium.

If a plasma discharge gas is introduced with a film forming gas in step (a), it is possible to perform a plasma Chemical Vapor Deposition process in which a film is vapor grown on the surface of the object to be treated or workpiece in step (d).

In any event, it is preferable that the treatment is performed after or while the object to be treated or workpiece is heated by the heat source at, for example, about 90° C./min or higher.

It is therefore an object of the present invention to provide a plasma treatment apparatus and method which treats an object to be treated or workpiece at a relatively low temperature and in a relatively short time by using a plasma generated at or about atmospheric pressure and applying heat, while reducing the reflection of radiant heat by the plasma generating electrodes.

Another object of the present invention is to provide an inexpensive and small-sized plasma treatment apparatus which treats an object to be treated or workpiece in a relatively short time without the need of a vacuum forming device by using an atmospheric plasma and applying radiated heat, and a method of plasma treatment using the atmospheric plasma treatment apparatus disclosed.

Still other objects and advantages of the Invention will in part be obvious and will in part be apparent from the specification.

The invention accordingly comprises the several steps and the relation of one or more of such steps with respect to each of the others, and the apparatus embodying features of construction, combinations of elements and arrangements of parts which are adapted to affect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

A plasma treatment apparatus and method relating to the present invention will now be described by way of example with reference to the drawings wherein like reference numbers indicate like parts.

General Configuration of Plasma Treatment Apparatus

Figure 1:
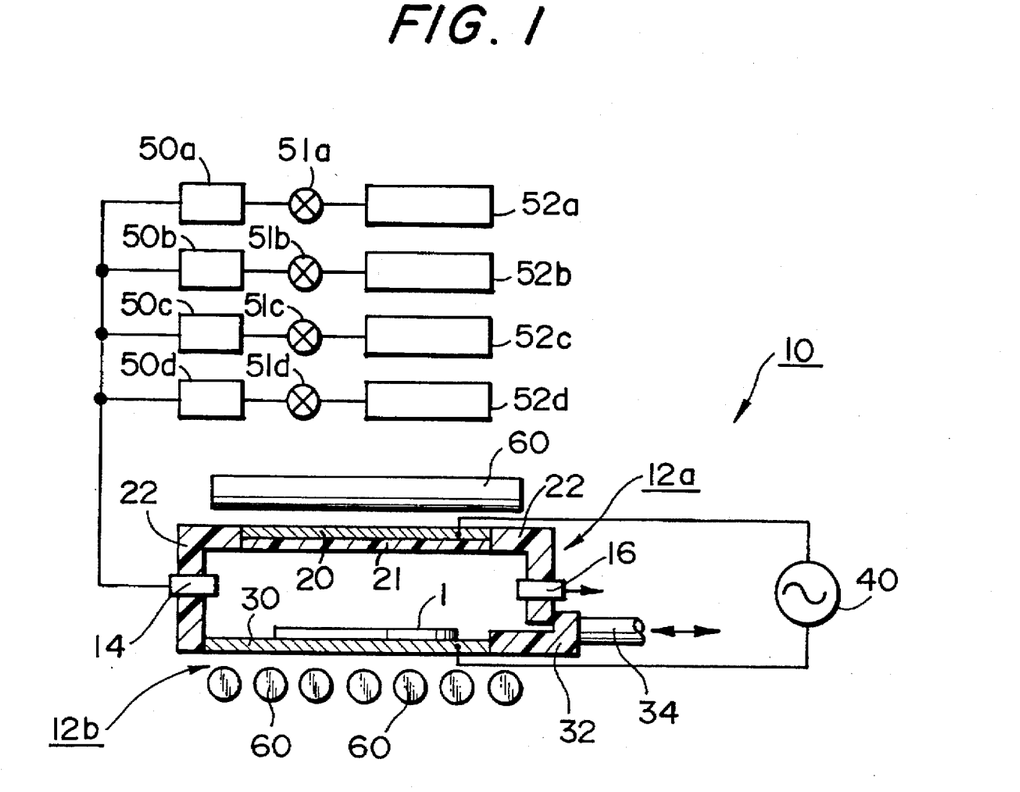
FIG. 1 is a schematic section of a plasma treatment apparatus constructed in accordance with one embodiment of the present invention.

As shown in FIG. 1, a plasma treatment apparatus 10 comprises an upper chamber portion 12a and a lower chamber portion 12b. Upper chamber portion 12a is connected to a gas inlet 14 and a gas outlet 16.

Upper chamber portion 12a includes an upper electrode 20 which is a plasma generating electrode, a dielectric member 21 which is disposed at the bottom of upper electrode 20 and may be formed of $SiO_2$ with a thickness of about 1 mm, and a chamber wall 22 supporting upper electrode 20. Gas inlet 14 and gas outlet 16 are in fluid communication with chamber wall 22. Dielectric member 21 over upper electrode 20 prevents an abnormal electrical discharge which may occur, particularly when the plasma generation is carried out at or about atmospheric pressure.

On the other hand, lower chamber portion 12b includes a lower electrode 30 which is also a plasma generating electrode disposed parallel to upper electrode 20, a vertical chamber wall 32 supporting lower electrode 30 and a horizontal rod 34 connected to vertical chamber wall 32. Lower chamber portion 12b is horizontally movable as a unit as shown by the arrow in FIG. 1. The movement of lower chamber portion 12b may place or permit the placement of an object to be treated or workpiece, such as a semiconductor wafer 1 on lower electrode 30, and conducts semiconductor wafer 1 or other workpiece into and out of plasma treatment apparatus 10. When lower chamber portion 12b is at a position as shown in FIG. 1, vertical chamber wall 32 thereof is engaged with chamber wall 22 of upper chamber portion 12a. At the same time, the end face of lower electrode 30 contacts the inside of chamber wall 22. Thus, the treatment space in plasma treatment apparatus 10 can be segregated from the outside ambient atmosphere. However, plasma treatment apparatus 10, according to this embodiment does not require airtight sealing against the outside ambient atmosphere, since it is particularly well adapted to perform an atmospheric plasma treatment.

Chamber wall 22 and vertical chamber wall 32 may be formed of a material such as quartz. Alternatively, the chamber walls may be formed or a metal such as SUS or Al, the inside thereof being coated with Si. The material of which upper electrode 20 and lower electrode 30 are formed of will be described later.

Upper electrode 20 and lower electrode 30 may be connected to an RF power supply 40 which provides a radio frequency power of 13.56 MHZ and 100 W, for example. In addition to such radio frequency power, a given process gas may be conducted into the interior of plasma treatment apparatus 10 through gas inlet 14 to generate a plasma discharge at or about atmospheric pressure.

Lower electrode 30 functions as a susceptor on which semiconductor wafer 1 to be treated is placed, and is conveniently called "susceptor electrode". Upper electrode 20 functions as an electrode which is opposite to susceptor electrode 30 and is conveniently called "opposite electrode". Thus, susceptor electrode 30 and opposite electrode 20 form a parallel-plate type plasma generating electrode pair.

Gas inlet 14 is connected to a plurality of gas containers 52a, 52b, 52c and 52d via flow meters 50a, 50b, 50c and 50d and valves 51a, 51b, 51c and 51d, respectively. Gas container 52a contains a plasma discharge gas such as Helium (He); gas container 52b contains a reactive gas that is adaptive for the particular plasma treatment desired. Such a reactive gas may be, for example, oxygen ($O_2$), if the surface of semiconductor wafer 1 should be subjected to oxidation. Gas container 52c contains a purging gas used to carry semiconductor wafer 1 into and out of plasma treatment apparatus 10. The purging gas may typically be $N_2$. If the surface of semiconductor wafer 1 should be subjected to nitriding, the nitrogen ($N_2$) which fills gas container 52c may also be used as a reactive gas for nitriding. Gas container 52d may contain an etching gas for cleaning the inner walls of plasma treatment apparatus 10 which may be contaminated after a number of treatment processes have been carried out. Such an etching gas may be, for example, $CF_4$.

Figure 2:
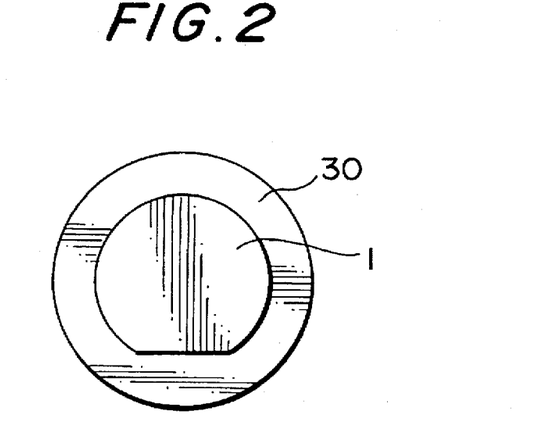
FIG. 2 is a plan view of a lower electrode shown in FIG. 1, with an object to be treated mounted at the top.

When plasma treatment apparatus 10 of this embodiment is used to treat the surface of semiconductor wafer 1 with the ions, free radicals and activated gas species of a reactive treatment gas excited by plasma discharge, a lamp heat annealing may also be used to further improve the reaction rate between the ions, free radicals and activated gas species and the surface of semiconductor wafer 1, thus speeding the treatment time. More particularly, Rapid-Thermal (RT) treatment means such as halogen lamps 60 are disposed outside of upper electrode 20 and lower electrode 30 to raise the temperature of semiconductor wafer 1 rapidly. To equalize the temperature distribution over the surface of semiconductor wafer 1, upper and lower halogen lamps 60 may be arranged so that their axes are orthogonal. For the same purpose, furthermore, the external diameter of lower electrode 30 is set to be larger than that of semiconductor wafer 1, as shown in FIG. 2. If the external diameter of semiconductor wafer 1 is about six inches, for example, the external diameter of lower electrode 30 will be about eight inches. Thus, it is possible to equalize the temperature distribution of eight inch lower electrode 30 at the central area thereof, and to place semiconductor wafer 1 on the central, evenly heated area of lower electrode 30.

In this embodiment, upper electrode 20 and lower electrode 30 are formed of doped silicon in which impurities such as phosphorus and boron are doped into the silicon substrate. Such impurities preferably have a concentration of $10^{15}$ atoms/$cm^3$ or more, and more preferably, between about $10^{15}$ atoms/$cm^3$ and $10^{19}$ atoms/$cm^3$ as taken by the source and drain of an MOS transistor.

The material constituting upper electrode 20 and lower electrode 30 should have the following characteristics in order to function as effective plasma generating electrodes in this invention: (1) electrical conductivity; (2) heat transmissive for heat rays such as infrared rays; and (3) heat resistance to temperatures equal to or higher than about 200° C.; (4) corrosion-resistance and (5) lower electrode 30 should have a specific heat capacity substantially equal to that of semiconductor wafer 1.

When upper electrodes 20 and susceptor electrode 30 are formed of doped silicon as described above, they will have specified electrical conductivity, being established as the source and drain of a MOS transistor. The doped silicon is resistant to a temperature of up to about 200° C. and corrosion which produces impure particles on semiconductor wafer 1, when the doped silicon is subjected to atmospheric plasma. Furthermore, the doped silicon has substantially the same infrared transmissivity as that of the silicon. With the aforementioned impurity concentration, the doped silicon has transmissivity of 70% at room temperature.

As with pure silicon, the transmissivity of doped silicon changes relative to temperature. For example, transmissivity generally decreases at a temperature of about 500° C., and further decreases as the temperature increases. Transmissivity also decreases at a wavelength of about 1550 nm and further decreases as the wavelength increases. Doped silicon may be used as a light transmissive electrode, for example, at 600° C. or lower, and preferably at 500° C. or lower and more preferably at 400° or lower. In general, the lower the temperature, the greater the transmissivity. Preferably, for the doped silicon used, a transmissivity of at least about 50% may be obtained at a temperature of about 400° C.

When the doped silicon is used to form lower electrode 30, it is preferable that the specific heat capacity of lower electrode 30 is substantially equal to that of semiconductor wafer 1. The specific heat capacity of the doped silicon described above is substantially equal to that of the silicon substrate of a typical silicon semiconductor workpiece. Thus, a heat shock will not be generated between semiconductor wafer 1 and lower electrode 30, even if lower electrode 30 is heated by lamp 60.

In addition to doped silicon, the electrode material meeting the aforementioned characteristics may also include silicon carbide (SiC) and indium tin oxide (ITO). Each of these materials has electrical conductivity, light transmissivity and a resistance to a temperature of about 200° C. or higher, as in the doped silicon. Silicon carbides (SiC) are inferior to the doped silicon which has greater electric resistance. Indium tin oxide is inferior to the doped silicon because it has lower heat resistance, but ITO is effective for carrying out treatment at a temperature between about 200° C. and 300° C.

It is possible to use carbon (C) for lower electrode 30, although carbon absorbs heat from the heat source because carbon releases the heat as heat energy to heat the plasma generating area. However, carbon is inferior in that oxidation of the electrode is fast, and disadvantageous in that carbon subjected to oxidation takes the form of $CO_2$ and permeates the treatment space.

In order to improve the above second characteristic, that is, heat transmissiveness, it is desirable that the electrodes are as thin as possible, and the thickness of the electrodes is therefore reduced to 1 mm or less.

The material of upper electrode 20 and lower electrode 30 in this embodiment is mainly characterized in that it permits heat rays such as infrared rays from lamps 60 to be transmitted for effectively heating semiconductor wafer 1, while maintaining the electrical conductivity necessary for plasma generating electrodes. In view of this, it is preferred that upper electrode 20 and lower electrode 30 are as thin as possible, and have at least a thickness of less than the thickness of surrounding chamber walls 22 and 32, as shown in FIG. 1, which should be thick enough to be strong enough for supporting the chambers. The thickness of upper electrode 20 and lower electrode 30 is preferably 1 mm or less, and more preferably between 0.3 mm and 0.6 mm. If the wall-thickness is less than the lower limit, it is impossible to ensure the mechanical strength of the electrodes. If the wall-thickness exceeds the upper limit, the light transmissivity decreases and thus reduces the heating efficiency.

In this embodiment, dielectric member 21 is disposed at the bottom of upper electrode 20. Forming dielectric member 21 of $SiO_2$ and a thickness of about 1 mm ensures light transmissivity.

Oxidation Treatment

Lower chamber portion 12b is first retracted to a position not directly opposite to upper chamber 12a, and then, for example, semiconductor wafer 1, at about room temperature, is placed on lower electrode 30. Lower chamber portion 12b is then moved directly opposite upper chamber 12a to form a treatment space between upper chamber 12a and lower chamber 12b, whereby the space is segregated from outside ambient atmosphere, as shown in FIG. 1. Nitrogen ($N_2$) is then conducted from gas container 52c into plasma treatment apparatus 10 through flow meter 50c and gas inlet 14. At the same time, $N_2$ is expelled from plasma treatment apparatus 10 into the outside atmosphere through gas outlet 16 so that the ambient air atmosphere around semiconductor wafer 1 will be replaced with a nitrogen rich atmosphere.

Thereafter, halogen lamps 60 are energized to rapidly heat semiconductor wafer 1 from about room temperature up to about 500° C. for five seconds at an average heating rate of for example, about 90° C. per minute or higher. Infrared rays from halogen lamps 60 are radiated onto semiconductor wafer 1 through upper electrode 20 and lower electrode 30 formed of, for example, doped silicon as described above. In this manner, semiconductor wafer 1 can also be heated rapidly to a desired temperature by using the conventional RT process.

Immediately after semiconductor wafer 1 hat been heated to the desired temperature, the gas conducted into plasma treatment apparatus 10 is switched from $N_2$ gas, to Helium (He) gas, which is a gas capable of easily generating a plasma discharge, contained in gas container 52a. Radio frequency power of 13.56 MHZ and 100 W is then applied to upper electrode 20 and lower electrode 30 to generate an atmospheric plasma discharge therebetween. Once a stable discharge is generated, a reactive gas, for example, Oxygen ($O_2$) gas, which is an oxidizing gas, contained in gas container 52b, is added to the gas conducted into plasma treatment apparatus 10 by valving. The oxygen and helium supplied onto the surface of semiconductor wafer 1 are excited by the plasma so as to oxidize the surface of semiconductor wafer 1. Since semiconductor wafer 1 has been pre-heated by halogen lamps 60, semiconductor wafer 1 or its silicon substrate for example, can be plasma oxidized up to a depth of 100 Angstroms in, for example, 10 seconds.

According to the plasma oxidation process, oxygen molecules react more than oxygen radicals with the hydrogen bonds of the silicon in the silicon oxide film. Thus, it is possible to increase the dielectric strength in the silicon oxide film more than that of the conventional heat oxidation. For example, if a silicon oxide film having a thickness of 200 Angstroms is formed within 100% oxygen atmosphere under normal pressure without plasma, the dielectric strength becomes 8–10 MV/cm. In the presence of a plasma, however, the dielectric strength increases up to 10–12 MV/cm.

Nitriding Treatment

According to this embodiment, semiconductor wafer 1 is subjected to nitriding following the oxidation in the same chamber. Therefore, the reactive gas conducted into plasma treatment apparatus 10 is switched from oxygen ($O_2$) to nitrogen ($N_2$). This switching may be accomplished by regulating valves 51b and 51c, thus switching gas inlet 14 from gas container 52b to gas container 52c.

In parallel with the switching of the gases, the power to halogen lamps 60 is increased to raise the temperature of semiconductor wafer 1 up to about 800° C. in three seconds, for example.

Consequently, the atmospheric plasma generation is maintained by the plasma discharge gas i.e. He, which is continuously conducted into plasma treatment apparatus 10. At the same time, nitrogen ($N_2$) conducted into plasma treatment apparatus 10 in place of oxygen ($O_2$) is excited by the plasma. The resultant ions, free radicals and activated gas species from the nitrogen can nitride the oxide film previously formed on the silicon substrate of semiconductor wafer 1 up to a depth of about 20 Angstroms in, for example, 60 seconds.

The conventional vacuum plasma treatment requires nitriding a semiconductor wafer at a high temperature of 1100° C. in an atmosphere of ammonia or $N_2O$ through a rapid thermal heating system. The prior an treatment further requires 60 seconds to nitride the semiconductor wafer up to a depth of 20 Angstroms. In contrast, the method of this embodiment requires a lower temperature with a greatly reduced treatment time. In order to improve the reactivity, the prior art requires a reactive gas, such as ammonia and $N_2O$ which should be handled carefully. However, the invention herein uses harmless $N_2$ for treatment.

As described, after the oxide film has been formed on the silicon substrate and then partially nitrided to form a partial nitride film in the same chamber, and when oxygen ($O_2$) is again used in place of nitrogen ($N_2$), it is possible to form an Oxide Nitride Oxide (ONO) film. The third oxide film may be formed by treating semiconductor wafer 1 to create an oxide with a depth of 40 Angstroms in 120 seconds, after the oxygen has been conducted into plasma treatment apparatus 10.

When semiconductor wafer 1 is treated at a low temperature and for a short time, the treatment can be carried out with an improved throughput and without any crystalline defect on the silicon substrate due to thermal stress or thermally induced diffusion. When the treatment rate, for example, the oxidation reaction, is to be changed, the space between upper electrode 20 and lower electrode 30 may be increased to reduce the plasma density, and thus decreasing the treatment rate, for example. Conversely, if the space between upper electrode 20 and lower electrode 30 is decreased, the oxidation rate can be increased. For such a purpose, it is desirable to provide a mechanism for adjusting the space between upper electrode 20 and lower electrode 30.

The invention herein may also be adapted to clean the contaminated interior of plasma treatment apparatus 10 after a plurality of process cycles have been carded out, when forming a sheet-like ONO film and replacing semiconductor wafer 1. The cleaning step operates in sequence so that the cleaning is performed automatically after the completion of a specified number of process cycles.

The cleaning step is carried out after the removal of the treated semiconductor wafer 1 by displacing lower chamber portion 12b, and then returning lower chamber portion 12b to the position shown in FIG. 1. The treatment space without semiconductor wafer 1 is thus separated from the atmosphere by upper chamber portion 12a and lower chamber 12b. It is noted herein that only nitrogen ($N_2$) is conducted into plasma treatment apparatus 10 when semiconductor wafer 1 is removed, thus preventing the formation of a natural oxide film on the surface of semiconductor wafer 1 at a high temperature.

After semiconductor wafer 1 has been removed from plasma treatment apparatus 10, the nitrogen conducted thereinto is replaced with an etching gas. The etching gas includes helium (He), being a plasma discharge gas, which may fill gas container 52a, and a reactive etching gas, such as $CF_4$ which may fill gas container 52d.

When these gases are conducted into the interior of plasma treatment apparatus 10 and a radio frequency power is supplied to upper electrode 20 and lower electrode 30, helium is excited to generate an atmospheric plasma, and at the same time, the reactive etching gas, $CF_4$, is activated. The ions, free radicals and activated gas species of $CF_4$ etch and clean the inside of plasma treatment apparatus 10, that is, inner chamber walls 22 and 23 and of upper electrode 20 and lower electrode 30. At this point, by heating the interior of plasma treatment apparatus 10 to a specified temperature, it is possible to enhance reactions for the etching and reduce the etching time.

The cleaning step etches an oxide or nitride film on the surfaces of upper electrode 20 and other components through the aforementioned process. The reaction product is exhausted through gas outlet 16 to complete the cleaning step for plasma treatment apparatus 10. Thus, it is possible to prevent the oxide or nitride particles from upper electrode 20 and other components from being deposited on semiconductor wafer 1, and to improve the yield in spite of the repetitive process of forming the ONO film.

First Modified Structure of Plasma Treatment Apparatus

Figure 3:
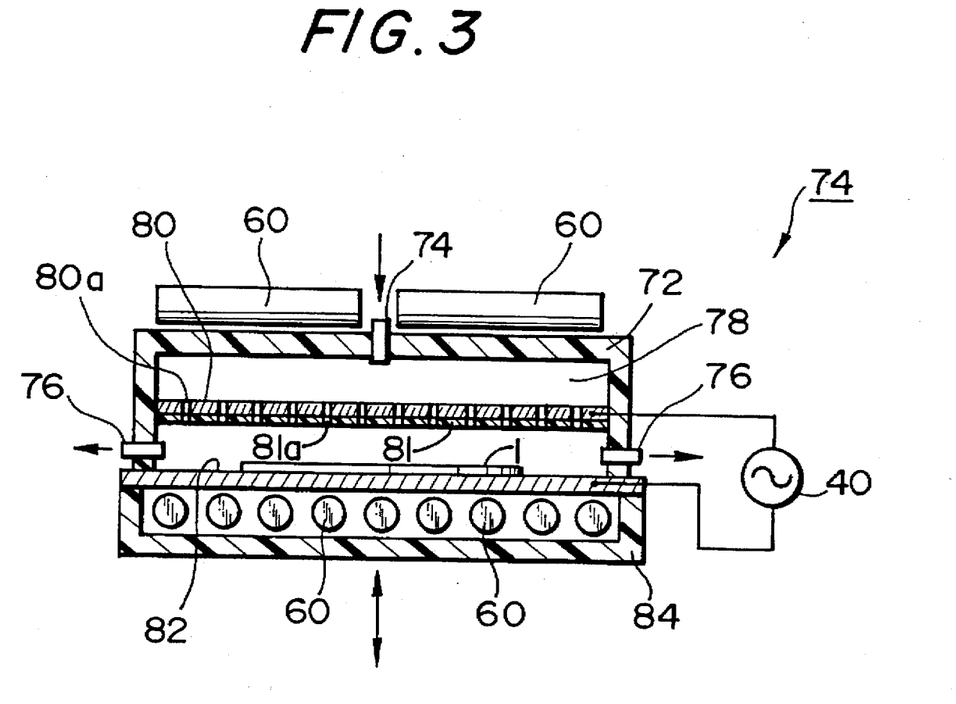
FIG. 3 is a schematic section of a modification of a plasma treatment apparatus constructed in accordance with the present invention.

The description now turns to an alternative embodiment of the apparatus of the present invention applied to a plasma treatment apparatus in which the gases are conducted from above an object to be treated or workpiece. With reference to FIG. 3, plasma treatment apparatus 70 comprises a chamber 72 having an open lower end. Chamber 72 includes a central top area connected to a gas inlet 74. Gas inlet 74 is connected to the gas containers in a manner similar to that as shown in FIG. 1. Chamber 72 includes an upper electrode 80 horizontally disposed therein and a dielectric member 81 which is disposed at the bottom of upper electrode 80. The lower open end of chamber 72 can be sealed with a lower electrode 82. Upper electrode 80 and lower electrode 82 form parallel-plate type plasma generating electrodes. Exhaust pipes 76 are connected through the side walls of chamber 72 below upper electrode 80 at various points in a circumferential direction.

Halogen lamps 60 are disposed above chamber 72 and below lower electrodes 82. The axes of the upper and lower halogen lamps 60 extend orthogonally, in a manner similar to that as in FIG. 1.

Halogen lamps 60 below lower electrode 82 are supported by a support member 84 which also supports lower electrode 82. Lower electrode 82, support member 84 and halogen lamps 60 are vertically movable as a unit, and may seal the open lower end of charnber 72 in the upper stop position shown in FIG. 3.

As in the embodiment of FIG. 1, upper electrode 80 and lower electrodes 82 are formed of, for example, doped silicon. Dielectric member 81 is formed of $SiO_2$ with a thickness of about 1 mm or less. Each of upper electrode 80 and dielectric member 81 have gas passing apertures 80a, 81a, respectively therethrough. A space formed between the top wall of chamber 72 and upper electrode 80 functions as a gas reservoir 78 for receiving the gas conducted through gas inlet 74.

As in plasma treatment apparatus 10 of FIG. 1, plasma treatment apparatus 70 of FIG. 3 can form ONO films continuously, for example. Particularly, in plasma treatment apparatus 70 of FIG. 3, a specified gas conducted through gas inlet 74 is once received by gas reservoir 78, and then conducted into a plasma generating area through upper electrode 80 which has gas passing apertures 80a. Thus, upper electrode 80 and dielectric member 81 also function as a diffusion board for diffusing the gas substantially uniformly over the plasma generating area through gas passing apertures 80a and 81a. The uniformly conducted and diffused gas is excited by plasma discharge for plasma treating semiconductor wafer 1.

Furthermore, in plasma treatment apparatus 70 of FIG. 3, infrared rays from the lower halogen lamps 60 pass through lower electrode 82 formed of the doped silicon and having a reduced wall-thickness so as to heat radiate semiconductor wafer 1 on lower electrode 82. Similarly, infrared rays from the upper halogen lamps 60 also heat radiate semiconductor wafer 1 through quartz chamber 72, upper doped silicon electrode 80 and dielectric member 81, composed of $SiO_2$. Thus, semiconductor wafer 1 can be heated rapidly to perform the oxidation and nitriding for a relatively short time, as in the embodiment of FIG. 1.

A system of conducting a gas from above upper electrode 80 for causing treatment of semiconductor wafer 1 may be applied in a manner similar to the procedures for plasma treatment as described with reference to the description of plasma treatment apparatus 10 shown in FIG. 1.

Second Modified Structure of Plasma Treatment Apparatus

Figure 4A:
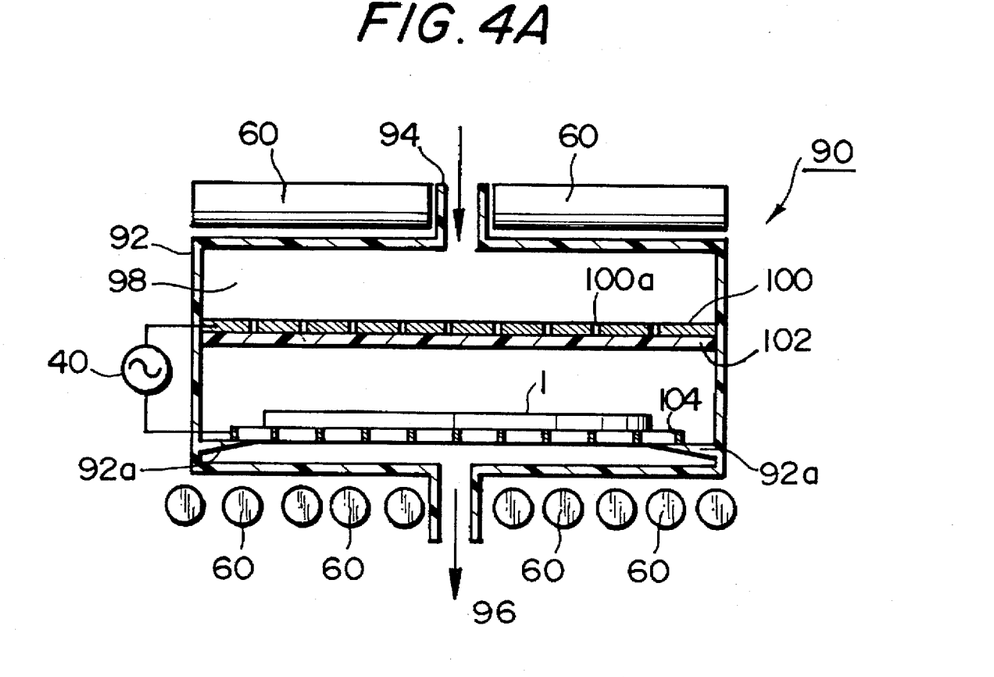
FIG. 4A is a schematic section of another modification of the plasma treatment apparatus constructed in accordance with the present invention.

FIG. 4A shows a plasma treatment apparatus 90 which has a chamber 92 including a gate (not shown) for conveying semiconductor wafer 1 thereinto and therefrom. The top of chamber 92 includes a gas inlet 94 extending therethrough and being connected thereto, while the bottom thereof is connected to a gas outlet 96. Chamber 92 includes an upper electrode 100 and a dielectric member 102, all of which are disposed one above another horizontally. Chamber 92 also includes a lower electrode 104 which is supported by support members 92a inwardly extending from the inner wall of chamber 92 and disposed parallel to upper electrode 100.

Halogen lamps 60 are provided above and below chamber 92, as in the embodiments of FIGS. 1 and 3.

Figure 4B:
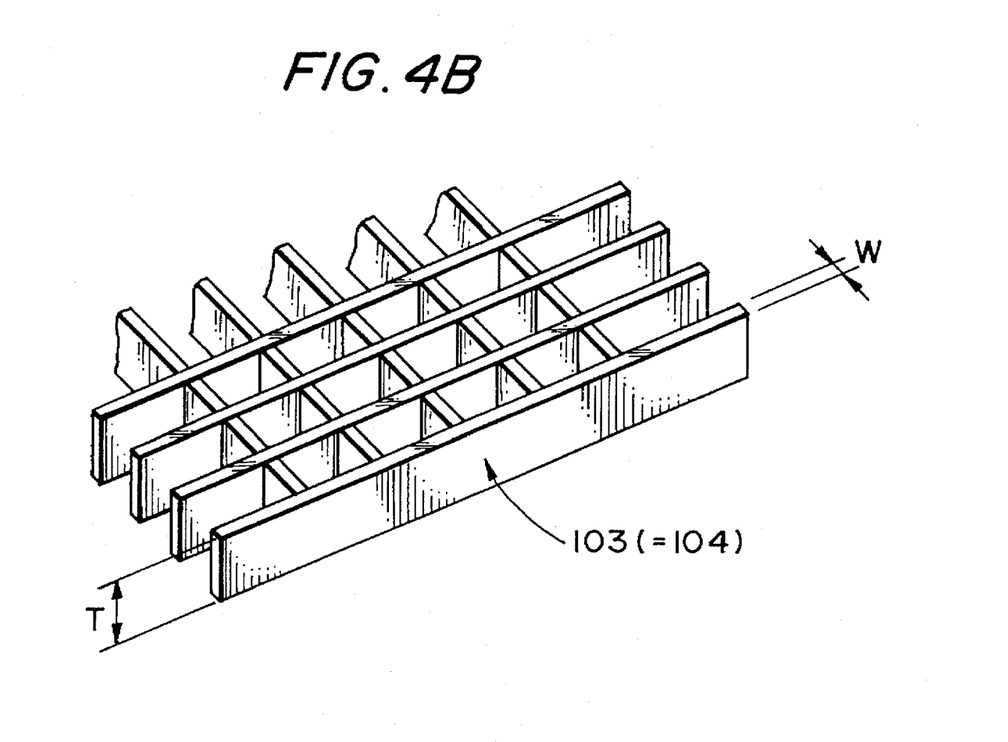
FIG. 4B is a schematic perspective view of mesh metal electrodes used in the plasma treatment apparatus shown in FIG. 4A.

Upper electrode 100 and lower electrode 104 are formed of a mesh metal 103, shown in FIG. 4B. Mesh metal 103 has a width W smaller than a thickness T and a large numerical aperture. Thus, mesh metal 103 permits high light transmissivity and provides a number of gas passing apertures. Dielectric member 102 is laminated over upper electrode 100 at the surface thereof facing lower electrode 104, and may be formed of a thin and porous ceramic sheet that has a thickness of 0.5 mm or less. Dielectric member 102 is formed on the bottom of upper electrode 100 to foster a uniform plasma discharge. In the treatment carried out at a low temperature between 200° C. and 300° C., lower electrode 104 is insusceptible to a heavy metal pollution. When the treatment is to be performed at a high temperature, it is possible to avoid a heavy metal pollution by coating mesh metal 103 with silicon or the like.

In the embodiment of FIG. 4A, the gas selected by valving is conducted into a gas reservoir 98 through gas inlet 94 and then into a plasma generating area through gas passing apertures 100a of upper electrode 100 and porous dielectric member 102. A plasma discharge is thus created between parallel plate type upper electrode 100 and lower electrode 104 to excite the gas. The ions, free radicals and activated gas species of the excited gas treats semiconductor wafer 1 on lower electrode 104 with a plasma. The gas is exhausted from the plasma treatment space through the gas passing apertures of lower electrode 104 and gas outlet 76 of chamber 72.

In this embodiment, as well, semiconductor wafer 1 to be treated by a plasma may be rapidly heated by halogen lamps 60. Semiconductor wafer 1 is heated mainly by halogen lamps 60 which are disposed below chamber 92. Infrared rays from lower halogen lamps 60 radiate and heat semiconductor wafer 1 through the quartz chamber 92 and lower mesh metal electrode 104.

On the other hand, upper halogen lamps 60 function as means for preheating the conducted gas. More particularly, the gas conducted into gas reservoir 98 through gas inlet 94 is pre-heated by the infrared rays radiated from upper halogen lamps 60 through the top wall of chamber 92. Thus, the conducted gas is pre-activated to generate a stable atmospheric plasma discharge in the plasma generating area. The radiant heat from upper halogen lamps 60 also rapidly heats semiconductor wafer 1 through the thin and porous upper electrode 100 of 0.5 mm thickness and porous dielectric member 102.

Mesh metal 103 has electrical conductivity while maintaining the high heat transmissivity of, for example, infrared rays; and thus functions in the same manner as in the doped silicon electrodes of FIGS. 1 and 3.

Third Modified Structure of Plasma Apparatus

The description now turns to various types of plasma treatment apparatus which are adapted to perform the same plasma treatment as in the previous embodiments without exposing semiconductor wafer 1 directly to an atmospheric plasma.

Figure 5:
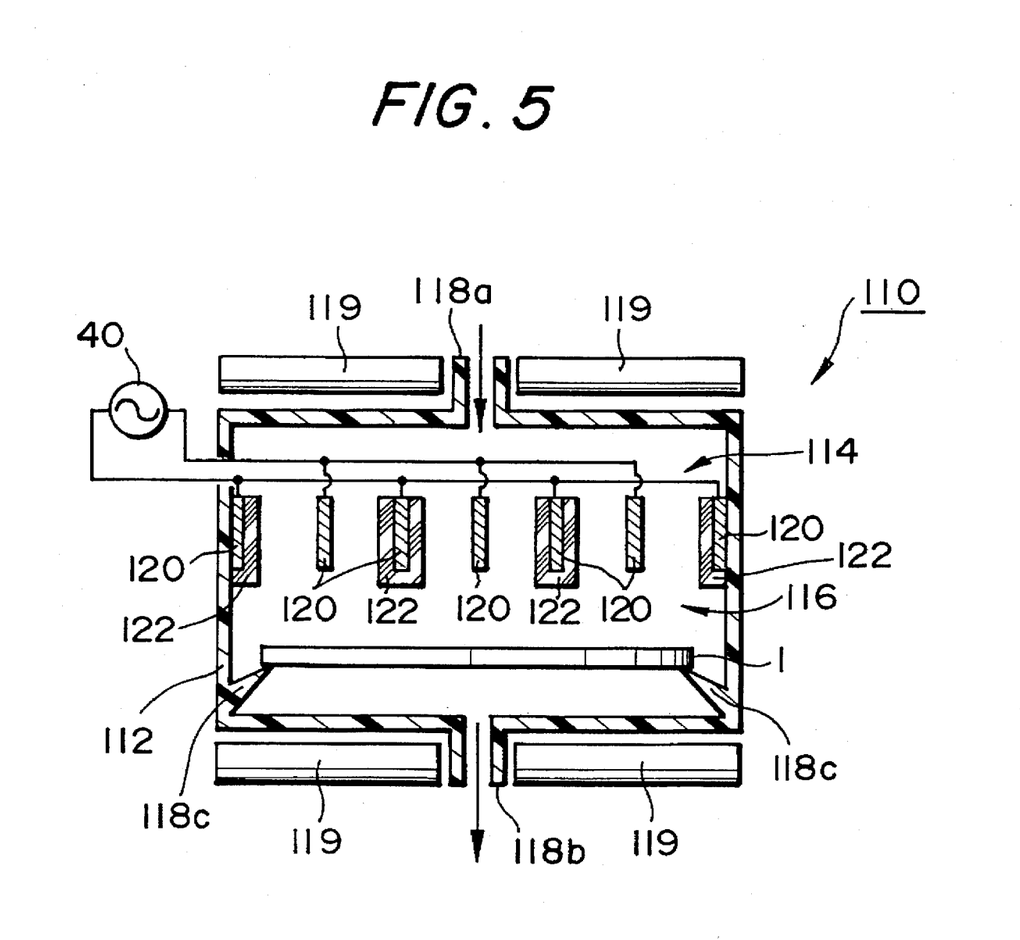
FIG. 5 is a schematic section of still another modification of the plasma treatment apparatus constructed in accordance with the present invention.

FIG. 5 shows a plasma treatment apparatus 110 having a common chamber 112 formed of quartz. Common chamber 112 is functionally divided into a first chamber 114 in which a conducted gas is activated by an atmospheric plasma discharge and a second chamber 116 in which the activated gas treats semiconductor wafer 1 with a plasma. The top of common chamber 112 is connected to a gas inlet 118a, while the bottom thereof is connected to gas outlet 118b. Support members 118c inwardly extend from the inner wall of common chamber 112 to support semiconductor wafer 1 in second chamber 116. Support members 118c include gas passing apertures (not shown) formed therethrough for conducting the gas from the surface of semiconductor wafer 1 into a space connected to gas outlet 96.

As in the previous embodiments, heating means 119 are disposed above and below common chamber 112. In this embodiment, heating means 119 may be a Kanthal (Trade Name) wire type heater, rather than the halogen lamps of the previous embodiments.

First chamber 114 in common chamber 112 may include a plurality of vertically disposed electrodes 120, for example. One of two adjacent electrodes 120 is covered with a dielectric member 122. Each pair of adjacent electrodes 120 form parallel plate type plasma generating electrodes. Each parallel plate type electrodes 120 is connected to an RF power supply 40.

In this embodiment, for example, oxygen and helium conducted into first chamber 114 through gas inlet 118a are pre-heated by Kanthal heaters 119, and then excited by a plasma generated between each pair of parallel plate type plasma generating electrodes 120.

The ions, free radicals and activated gas species of the gas excited by the plasma in first chamber 114 react upon the silicon substrate of semiconductor wafer 1 in second chamber 116 for example. Semiconductor wafer 1 is mainly heated by lower Kanthal heaters 119. Thus, it is possible using the system to form an oxide film of about 50 Angstroms in about ten minutes.

Figure 6:
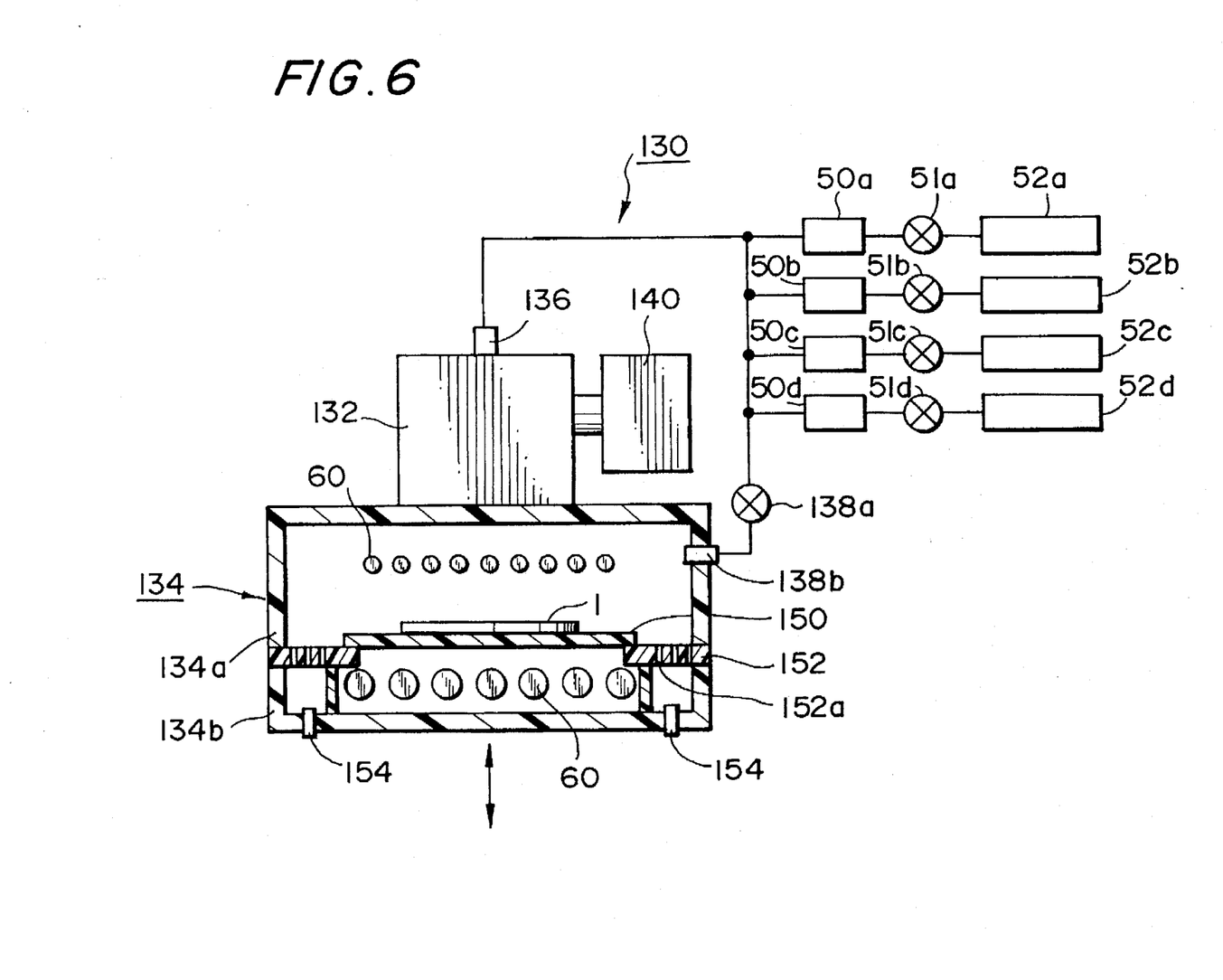
FIG. 6 is a schematic section of a further modification of the plasma treatment apparatus constructed in accordance with the present invention.

Plasma treatment apparatus 110 of FIG. 6 does not require any electrode for supporting semiconductor wafer 1. Therefore, semiconductor wafer 1 is radiated by heat rays from lower Kanthal heaters 119 through a quartz chamber 112. Although the embodiment of FIG. 6 may not use a RT system, it can accomplish the same heating efficiency as in the previous embodiments since the heat rays from Kanthal heaters 119 pass through only quartz chamber 112.

Unlike the prior art, the embodiment of FIG. 5 can suppress crystal defects caused by diffusion, due to the heat. The prior art, for instance, requires five to ten hours and a temperature of about 1,000° C. to form an LOCOS film such as a film of 5,000 to 15,000 Angstroms on a silicon substrate, which is used to separate IC components. However, this embodiment can form the same film within one hour at a temperature equal to or lower than 900° C. Thus, the present embodiment prevents crystal defects and reduces the treatment time. Besides, if boron and phosphorus are ion-implanted into the silicon substrate, it is possible to prevent the lowering of the boron and phosphorus concentrations per unit area due to thermodiffusion and the spread of the diffused layer. The treatment system of the invention herein can thus accomplish a concentrated and shallow diffusion layer such as is required to improve integration of the component.

Third Type of Plasma Treatment Apparatus

FIG. 6 shows a further embodiment of a microwave excitation type plasma treatment apparatus according to the present invention. In this figure, the plasma treatment apparatus 130 comprises a first chamber 132 and a second chamber 134. The top of first chamber 132 is connected to a gas inlet 136 which is connected to a plurality of gas containers 52a to 52d, as in the previously described embodiments. First chamber 132 is also connected to a magnetic microwave generating unit 140. Magnetic microwave generating unit 140 generates a microwave under a magnetic field, which radiates a microwave to a gas in first chamber 132. The conducted gas is excited and activated by the microwave to generate a plasma containing ions, free radicals and activated gas species.

Second chamber 134 is disposed below first chamber 132 and has a suscepter electrode 150 which may be formed of, for example, quartz, and supports semiconductor wafer 1. Suscepter electrode 150 is in turn supported by support members 152 which include a number of gas passing apertures 152a formed therethrough. Exhaust pipes 154 are connected to the chamber walls opposite of gas passing apertures 152a.

In second chamber 134, halogen lamps 60, which may be RT heaters, for example, are disposed on the opposite sides of semiconductor wafer 1 supported by suscepter electrode 150. Halogen lamps 60 rapidly heat semiconductor wafer 1. Halogen lamps 60 on the top side of semiconductor wafer 1 are preferably formed relatively thin in view of the uniform gas distribution which is preferable.

A lower chamber 134a is defined by suscepter electrode 150, support members 152 and other components. The top of lower chamber 134b is surrounded by an upper chamber 134a.

Lower chamber 134b is vertically movable relative to upper chamber 134a. When lower chamber 134b is in its lower position, semiconductor wafer 1 can be conveyed into or from upper chamber 134a. In its upper stop position, lower chamber 134b engages with upper chamber 134a to form a treatment space generally sealed from the outside ambient atmosphere. At the opening through which semiconductor wafer 1 is conveyed into or from upper chamber 134a, upper chamber 134a is connected to a gas inlet 138b through a valve 138a so that a purging gas such as nitrogen ($N_2$) is conducted into only second chamber 134.

In the embodiment of FIG. 6, the gas conducted into first chamber 132 is excited and activated to form ions, free radicals and activated gas species by microwaves from magnetic microwave generating unit 140. The ions, free radicals and activated gas species are conducted into second chamber 134 to, for example, oxidize the silicon substrate of semiconductor wafer 1. At the same time, semiconductor wafer 1 is rapidly heated by upper and lower halogen lamps 60 on the opposite sides of semiconductor wafer 1. Therefore, the plasma treatment can be accomplished in a short time and at a low temperature, as in the previously described embodiments and further, without directly exposing semiconductor wafer 1 to the plasma.

Since the infrared rays from halogen lamps 60 on the top side of semiconductor wafer 1 can directly radiate semiconductor wafer 1, the heat efficiency of semiconductor wafer 1 can further be improved. Since the infrared rays from lower halogen lamps 60 on the other side of semiconductor wafer 1 radiate semiconductor wafer 1 through quartz suscepter electrode 150, the same heat efficiency or even better as in the previously described embodiments can be accomplished.

The present invention is not limited to the above described embodiments, but may be applied in various modified forms without departing from the scope of the invention. Since the embodiments of the present invention have been applied to perform an atmospheric plasma treatment, it is unnecessary to seal the treatment space completely from the outside ambient atmosphere. If the portion on which semiconductor wafer 1 is placed is in the form of a horizontal movable belt conveyor, semiconductor wafers 1 can be treated continuously.

The embodiments of the present invention have been described as to a silicon oxide film and silicon nitride film formed on a semiconductor substrate; nevertheless, the present invention may also be applied to the formation of other films such as polysilicon films or high-melting metal silicide films. The semiconductor wafer or workpiece to be treated is not limited to silicon but may be formed of a compound of gallium-arsenic or the like. A Metal-Insulation-Metal (MIM) element used as a non-linear resistant element for a liquid crystal display is formed by sputtering and thermally oxidizing tantalum (conductor) onto an insulation substrate. The present invention may be applied to such an oxidation process as well. This enables the treatment to be carried out in a short time and at a low temperature, as described with respect to the previously described embodiments. It is known that the switching characteristic of the MIM element can be improved by nitriding the tantalum in the MIM element. The present invention can also be applied to such a nitriding process. The prior art transforms only a part of the tantalum into a tantalum nitride by doping and sputtering the tantalum. On the contrary, the present invention can form a film containing more tantalum nitride by nitriding the tantalum film.

Although a Thin Film Transistor (TFT) includes a quartz substrate (insulator), the present invention can also be applied to oxidize a polysilicon film on the quartz substrate. In this application, the present invention is superior in both the suppression of defects due to thermal stress and in throughput.

If the heat from the heat source is reduced in the present invention, the reaction rate will be reduced to provide a thinner film. For example, the present invention can form an oxide and nitride film having a thickness of 100 Angstroms or less on a silicon substrate. This is appropriate for the formation of a high-integrated IC and effective for a device using a tunnel current.

The present invention is not limited to oxidation and nitriding treatments, but may also be applied to other various treatments. For example, a plasma treatment apparatus including RT treating means can perform the nitriding treatment by use of nitrogen, as described. At this point, the plasma treatment apparatus can be used in a Rapid-Thermal-Anneal (RTA) process, if a plasma is not generated. This can provide a high general-purpose treatment apparatus which can execute atmospheric plasma oxidation and nitriding treatments through the RT system, in addition to the normal treatments such as annealing through the RT system. If only helium is conducted into such an apparatus, it is possible to etch semiconductors of silicon and other materials and insulators such as silicon oxide and nitride films. For example, a natural oxide film of the poor quality formed in the atmosphere may be removed by a helium plasma prior to the oxidation of a silicon substrate. This can improve the quality of an oxide film formed through the subsequent step.

It will thus be seen that the objects set forth above, among those made apparent from the preceding description, are efficiently attained and, since certain changes may be made in carrying out the above method and in the constructions set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A plasma treatment apparatus for treating a workpiece with ions, free radicals and activated gas species which are generated by a plasma discharge, comprising:
    a pair of spaced plasma generating electrodes across with an AC voltage is applied, said plasma generating electrodes including a suscepter electrode supporting said workpiece and an opposite electrode opposite said suscepter electrode; and
    a heat source for radiating heat rays to said workpiece; and wherein
    at least one electrode of said pair of plasma generating electrodes faces said heat source and is formed of a material which transmits said heat rays and has a heat resistance to a temperature of about 200° C. or higher.

2. The plasma treatment apparatus according to claim 1, wherein said at least one electrode of said pair of plasma generating electrodes facing said heat source is formed of doped silicon in which impurities are doped into a silicon substrate.

3. The plasma treatment apparatus according to claim 2, wherein said silicon substrate has an impurity concentration of $10^{15}$ atom/cm$^3$ and about $10^{19}$ atom/cm$^3$.

4. The plasma treatment apparatus according to claim 1, wherein said at least one electrode of said pair of plasma generating electrodes facing said heat source is formed of silicon carbide (SiC).

5. The plasma treatment apparatus according to claim 1, wherein said at least one electrode of said plasma generating electrodes facing said heat source is formed of indium-tin-oxide (ITO).

6. The plasma treatment apparatus according to claim 1, wherein said at least one electrode of said plasma generating electrodes opposite to said heat source has a thickness of 1 mm or less.

7. The plasma treatment apparatus according to claim 1, wherein said suscepter electrode faces said heat source, and wherein said suscepter electrode has an external diameter which is larger than said workpiece being supported on said suscepter electrode.

8. The plasma treatment apparatus according to claim 1, wherein said plasma is generated at or about atmospheric pressure.

9. The plasma treatment apparatus according to claim 8, further comprising a chamber wall supporting said opposite electrode, and wherein said suscepter electrode is movable relative to said chamber wall and at least in part segregates the internal space of said chamber wall from the outside ambient atmosphere when in position opposite to said opposite electrode engaged with said suscepter electrode.

10. The plasma treatment apparatus according to claim 9, wherein said chamber wall is formed of quartz and said suscepter electrode is thinner than said chamber wall.

11. The plasma treatment apparatus according to claim 1, wherein said heat source is located opposite to said opposite electrode, said apparatus further comprising a gas reservoir being formed between said chamber wall and said electrode and being connected to a gas inlet, and wherein said opposite electrode includes pores formed therethrough for allowing said gas to flow.

12. A plasma treatment apparatus for treating a workpiece through ions, free radicals and activated gas species generated by plasma discharge at or about atmospheric pressure, comprising:
    a first chamber including at least one pair of spaced plasma generating electrodes each of which generates a plasma discharge for exciting an introduced gas to form ions, free radicals and activated gas species;
    a second chamber in which said workpiece is disposed and treated by said ions, free radicals and activated gas species from said first chamber; and
    a heat source for heating and radiating said workpiece in said second chamber.

13. A plasma treatment apparatus for treating a workpiece through ions, free radicals and activated gas species generated by plasma discharge at or about atmospheric pressure, comprising:
    a first chamber for exciting an introduced gas by using microwaves to generate a plasma discharge in said gas thereby forming said ions, free radicals and activated gas species;
    a second chamber in which said workpiece is disposed and treated by said ions, free radicals and activated gas species from said first chamber; and
    a heat source for heating and radiating said workpiece in said second chamber.

14. The plasma treatment apparatus according to claim 12, wherein said heat source is disposed in said second chamber.

15. The plasma treatment apparatus according to claim 12, wherein said heat source is a rapid thermal heater for heating said workpiece at a rate of about 90° C./min. or faster.

16. A method of plasma treating a workpiece by exposure to ions, free radicals and activated gas species generated by plasma discharge in a gas, comprising the steps of:
    (a) introducing said gas at or about atmospheric pressure between a pair of plasma generating electrodes including a suscepter electrode supporting said workpiece and an opposite electrode opposite to said suscepter electrode;
    (b) applying an AC voltage across said pair of electrodes;
    (c) radiating heat rays from a heat source to said workpiece through at least one of said electrodes; and
    (d) treating said workpiece by causing said ions, free radicals and activated gas species generated by said plasma discharge generated between said pair of electrodes to react on said workpiece.

17. The method according to claim 16, wherein said gas of said introducing step (a) includes a plasma discharge gas and an oxidizing gas, and said treating step (d) is oxidating of the surface of said workpiece.

18. The method according to claim 16, wherein said gas of said introducing step (a) includes a plasma discharge gas and a nitriding gas, and said treating step (d) is nitriding of the surface of said workpiece.

19. The method according to claim 16, wherein said gas of said introducing step (a) includes a plasma discharge gas and an ashing gas, and said treating step (d) is ashing of the surface of said workpiece.

20. The method according to claim 16, wherein said gas of said introducing step (a) includes a plasma discharge gas and an etching gas, and said treating step (d) is etching of the surface of said workpiece.

21. The method according to claim 20, wherein the plasma discharge and etching gases are each helium.

22. The method according to claim 16, wherein said gas of said introducing step (a) includes a plasma discharge gas and a film forming gas, and said treating step (d) is vapor growth of a film on the surface of said workpiece.

23. The method according to claim 16, wherein said workpiece is heated by said heat source at a rate of about 90° C./min. or faster.

24. A method of plasma treating a workpiece by exposure to ions, free radicals and activated gas species generated by plasma discharge in a gas, comprising the steps of:

(a) introducing said gas at or about atmospheric pressure between a pair of plasma generating electrodes disposed in a first chamber;

(b) applying an AC voltage across said pair of plasma generating electrodes to generate a plasma discharge for exciting said gas to generate ions, free radicals and activated gas species;

(c) radiating heat rays from a heat source to said workpiece disposed in a second chamber; and (d) treating said workpiece by conducting said ions, free radicals and activated gas species generated in said first chamber into said second chamber in which said ions, free radicals and activated gas species are reacted with said workpiece.

25. A method of plasma treating a workpiece by exposure to ions, free radicals and activated gas species generated by plasma discharge in a gas, comprising the steps of:

(a) introducing said gas at or about atmospheric pressure into a first chamber;

(b) radiating microwaves into said first chamber to generate a plasma discharge, for exciting said gas to generate ions, free radicals and activated gas species;

(c) radiating heat rays to said workpiece disposed in a second chamber; and (d) treating said workpiece by conducting said ions, free radicals and activated gas species generated in said first chamber into said second chamber in which said ions, free radicals and activated gas species are reacted with said workpiece.

* * * * *